(12) United States Patent
Li et al.

(10) Patent No.: US 9,797,944 B2
(45) Date of Patent: Oct. 24, 2017

(54) TEST FIXTURE AND TEST METHOD USING THE SAME

(71) Applicants: Jian Li, Beijing (CN); Yongjun Liao, Beijing (CN); Yu Tan, Beijing (CN); Jianchao Zhang, Beijing (CN); Chunhua Zhang, Beijing (CN)

(72) Inventors: Jian Li, Beijing (CN); Yongjun Liao, Beijing (CN); Yu Tan, Beijing (CN); Jianchao Zhang, Beijing (CN); Chunhua Zhang, Beijing (CN)

(73) Assignees: BOE TECHNOLOGY GROUP CO., LTD., Beijing (CN); BOE (HEBEI) MOBILE DISPLAY TECHNOLOGY CO., LTD., Hebei (CN)

( * ) Notice: Subject to any disclaimer, the term of this patent is extended or adjusted under 35 U.S.C. 154(b) by 278 days.

(21) Appl. No.: 14/537,192

(22) Filed: Nov. 10, 2014

(65) Prior Publication Data

US 2016/0133171 A1 May 12, 2016

(51) Int. Cl.
*G01R 31/20* (2006.01)
*G01R 31/28* (2006.01)
*G01R 1/04* (2006.01)

(52) U.S. Cl.
CPC ....... *G01R 31/2891* (2013.01); *G01R 1/0408* (2013.01); *G01R 31/2808* (2013.01)

(58) Field of Classification Search
CPC .......... G01R 19/16519; G01R 31/2621; G09G 3/3241; G09G 3/325
See application file for complete search history.

(56) References Cited

U.S. PATENT DOCUMENTS 5,847,796 A * 12/1998 Uchiyama ........... G02F 1/13452
349/149
6,590,624 B1 * 7/2003 Lee ..................... G02F 1/13452
324/760.02

* cited by examiner

*Primary Examiner* — Tung X Nguyen
(74) *Attorney, Agent, or Firm* — Harness, Dickey & Pierce, P.L.C.

(57) ABSTRACT

The present disclosure relates to the field of display technology, in particular to a test fixture, comprising a pressing connection mechanism (1), an eccentric mechanism (2), and a working carrier (3), the pressing connection mechanism (1) and the working carrier (3) being arranged correspondingly, and the rotation of the eccentric mechanism (2) driving the pressing connection mechanism (1) to move up and down in a Y direction so as to conduct a signal pressing connection test for a tested product on the working carrier (3). The test fixture has a simple structure and steady properties, easy to be operated and maintained conveniently.

20 Claims, 7 Drawing Sheets

TEST FIXTURE AND TEST METHOD USING THE SAME

CROSS-REFERENCE TO RELATED APPLICATION

The present application claims and enjoys a priority of the Chinese patent application No. 201420249397.3, filed on May 15, 2014 and entitled "a test fixture", which is incorporated herein by reference in its entirety.

TECHNICAL FIELD

The present disclosure relates to a field of display technology, in particular to a test fixture and test method using the same.

BACKGROUND

At present, LCD (Liquid Crystal Display) has been widely used in production and living due to its technological superiority. In the production process of LCD, it often needs an auxiliary tool to be used together with a test signal machine so as to complete the test on a product in a COG (Chip On Glass) state after the LCD bonds IC (Integrated Circuit).

Such auxiliary tool is capable of providing a connecting channel for the product in a COG state after LCD bonds IC and the test signal machine, so that signals tested by the test signal machine can be transmitted to corresponding signal port in the product in a COG state. And the auxiliary tool can be used in simulating the state of a finished product of a liquid crystal module in a development phase of the tested product or used for sorting defective products in batch production. The auxiliary tool in the existing technology has a low structural stability and a large number of assembling components, leading to inconvenient operation, great difficulties and high costs in maintenance, and there is no stabilizing structure in the existing auxiliary tool, thereby its test accuracy is not high. Meanwhile, it is not easy to adjust and maintain the working carrier daily.

SUMMARY

The technical problem to be solved by the present disclosure is to provide a test fixture, which is used for testing a product in a COG state after a LCD bonds IC, and has a simple structure and steady properties, easy to be operated and maintained conveniently.

In order to solve the above technical problems, one embodiment of the present disclosure provides a test fixture. The test fixture comprises a pressing connection mechanism, an eccentric mechanism, and a working carrier. The pressing connection mechanism and the working carrier are arranged correspondingly, and the rotation of the eccentric mechanism drives the pressing connection mechanism to move up and down in a Y direction so as to conduct a signal pressing connection test for a tested product on the working carrier.

The test fixture according to the embodiment of the present disclosure further comprises a first adjustment mechanism for controlling and adjusting the working carrier to move left and right in an X direction, and a second adjustment mechanism for controlling and adjusting the working carrier to move up and down in the Y direction.

In the test fixture according to the embodiments of the present disclosure, the eccentric mechanism comprises a main eccentric block, a stress-bearing plate and a guide shaft. The stress-bearing plate is positioned below the main eccentric block, and the stress-bearing plate is mounted with the guide shaft. The guide shaft is connected to the pressing connection mechanism above the main eccentric block, and the main eccentric block rotates and presses downward to the stress-bearing plate. The stress-bearing plate drives the pressing connection mechanism via the guide shaft to move up and down in the Y direction.

In the test fixture according to the embodiments of the present disclosure, the main eccentric block is mounted with an eccentric handle for driving the rotation of the main eccentric block.

In the test fixture according to the embodiments of the present disclosure, a bearing plate is provided between the main eccentric block and the pressing connection mechanism. And a flange bearing is fixed on the bearing plate, and the guide shaft penetrates through the flange bearing and is connected to the pressing connection mechanism.

In the test fixture according to the embodiments of the present disclosure, a restoring spring is provided out of the guide shaft, and the restoring spring is positioned between the bearing plate and the pressing connection mechanism for restoring the pressing connection mechanism upward after a test is completed.

In the test fixture according to the embodiments of the present disclosure, a rolling bearing is provided between the main eccentric block and the stress-bearing plate.

In the test fixture according to the embodiments of the present disclosure, the pressing connection mechanism comprises a main pressing head, a pressing connection slider and a pressing connection guide rail. One end of the main pressing head is fixed on the guide shaft, and the other end of the main pressing head is slidablely mounted to the pressing connection guide rail via the pressing connection slider in up and down directions.

In the test fixture according to the embodiments of the present disclosure, the main pressing head is provided with a vice pressing head for mounting the tested product.

In the test fixture according to the embodiments of the present disclosure, one end of the main pressing head is fixed to a top end of the guide shaft via an adjuster, and the pressing connection slider is mounted to the other end of the main pressing head via a connecting plate.

In the test fixture according to the embodiments of the present disclosure, the first adjustment mechanism comprises an X-directional guide rail mounting plate, an X-directional slider mounting plate, a guiding guide rail and a guiding slider. The guiding guide rail is mounted on the X-directional guide rail mounting plate, and the X-directional slider mounting plate is slidablely mounted to the guiding guide rail via the guiding slider for driving the working carrier to move in the X direction.

In the test fixture according to the embodiments of the present disclosure, the X-directional guide rail mounting plate is fixed under the working carrier via a backlight plate, and a light hole is provided on the working carrier for aligning adjustment.

In the test fixture according to the embodiments of the present disclosure, an adjusting screw and a fastening screw are mounted on the X-directional guide rail mounting plate.

In the test fixture according to the embodiments of the present disclosure, the second adjustment mechanism comprises a Y-directional adjusting carrier and a height adjusting side plate The height adjusting side plate is provided on the Y-directional adjusting carrier, and the height adjusting side plate is provided under the X-directional guide rail mounting plate for driving the working carrier to move in the Y direction.

In the test fixture according to the embodiments of the present disclosure, a pressing connection shape of the main pressing head is engaged to a silica gel sheet as a pressure buffer, a PCB or a FPC to be tested so that a signal source required for the test is steadily and accurately contacted with and stably connected with the tested product.

The embodiments of the present disclosure further provide a test method using the above test fixture.

The above technical solution of the present disclosure has the following advantageous technical effects: the eccentric mechanism of the test fixture in the present disclosure drives the pressing connection mechanism to move in the Y direction, and the pressing connection mechanism and the working carrier are arranged correspondingly for conducting a signal pressing connection test for a tested product on the working carrier. The test fixture provides a connecting channel for a product in a COG state after a LCD bonds IC and a test machine so that test signals of the test machine can be transmitted to corresponding signal port in the tested product. And the test fixture can be used in simulating the state of a finished product of a liquid crystal module in a development phase of the tested product or used for sorting defective products in batch production. The test fixture has a simple structure and steady properties, easy to be operated and maintained conveniently.

Wherein, 1: pressing connection mechanism; 2: eccentric mechanism; 3: working carrier; 4: first adjustment mechanism; 5: second adjustment mechanism; 7: backlight plate; 8: mounting pad; 11: main pressing head; 12: pressing connection slider; 13: pressing connection guide rail; 14: vice pressing head; 21: eccentric handle; 22: main eccentric block; 23: stress-bearing plate; 24: guide shaft; 25: bearing plate; 31: light hole; 41: X-directional guide rail mounting plate; 42: X-directional slider mounting plate; 43: guiding guide rail; 44: guiding slider; 51: Y-directional adjusting carrier; 52: height adjusting side plate; 111: adjuster; 121: connecting plate; 221: rolling bearing; 241: flange bearing; 242: restoring spring; 411: adjusting screw; 412: fastening screw; 413: engaged plate.

DETAILED DESCRIPTION

The embodiment of the present disclosure will be further described hereinafter in details in conjunction with the drawings and examples. The examples below are used for explaining the present disclosure, rather than limiting the scope thereof.

In the description of the present disclosure, unless otherwise specified, "a plurality of" means two or more than two; directions or positional relations indicated by terms such as "up", "down", "left", "right", "in" "out", "front end", "back end", "head", and "tail" are directions and positional relations shown based on the drawings, only for the convenience of describing the present disclosure and simplifying the description thereof other than indicating or suggesting that the devices or elements as mentioned must have a special direction, or be configured and operated in a special direction, thus cannot be construed as a limitation to the disclosure. Further, terms such as "first", "second" and "third" are only for the purpose of description, but cannot be construed to indicate or suggest relative importance.

In the description of the present disclosure, it has to be indicated that, unless otherwise specified and defined definitely, terms "interconnect" and "connect" shall be understood in a broad sense, e.g., it is possible to be connected fixedly, detachably, or integrally; it is possible to be connected mechanically, or electrically; it is possible to be interconnected directly, or indirectly via an intermediary. For an ordinary person skilled in the art, he may understand the specific meaning of the aforementioned terms in the disclosure according to specific conditions.

Except as may be expressly otherwise indicated, the article "a" or "an" if and as used herein is not intended to limit, and should not be construed as limiting, a claim to a single element to which the article refers. Rather, the article "a" or "an" if and as used herein is intended to cover one or more such elements, unless the text taken in context clearly indicates otherwise.

Figure 1:
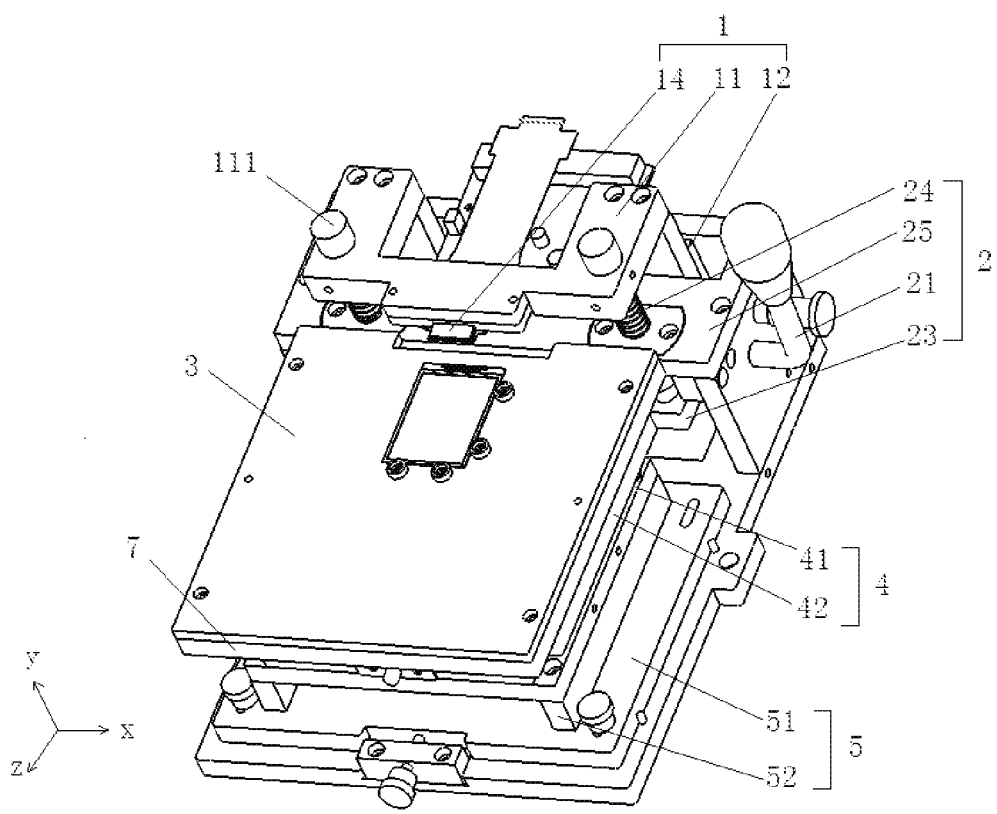
FIG. 1 is a perspective view showing a test fixture according to the embodiment of the present disclosure.

As shown in FIG. 1, the test fixture in the embodiment comprises a pressing connection mechanism 1, an eccentric mechanism 2, a working carrier 3, a first adjustment mechanism 4 and a second adjustment mechanism 5. The eccentric mechanism 2 drives the pressing connection mechanism 1 to move up and down in a Y direction, and the pressing connection mechanism 1 and the working carrier 3 are arranged correspondingly for conducting a signal pressing connection test for a tested product on the working carrier 3. The first adjustment mechanism 4 controls and adjusts the working carrier 3 to move in an X direction, and the second adjustment mechanism 5 controls and adjusts the working carrier 3 to move in the Y direction. The test fixture provides a connecting channel for a product in a COG state after a LCD bonds IC and a test machine so that test signals of the test machine can be transmitted to corresponding signal port in the tested product, and simulates the state of a finished product of a liquid crystal module for use in a development phase of the tested product or for sorting defective products in batch production.

Figure 2:
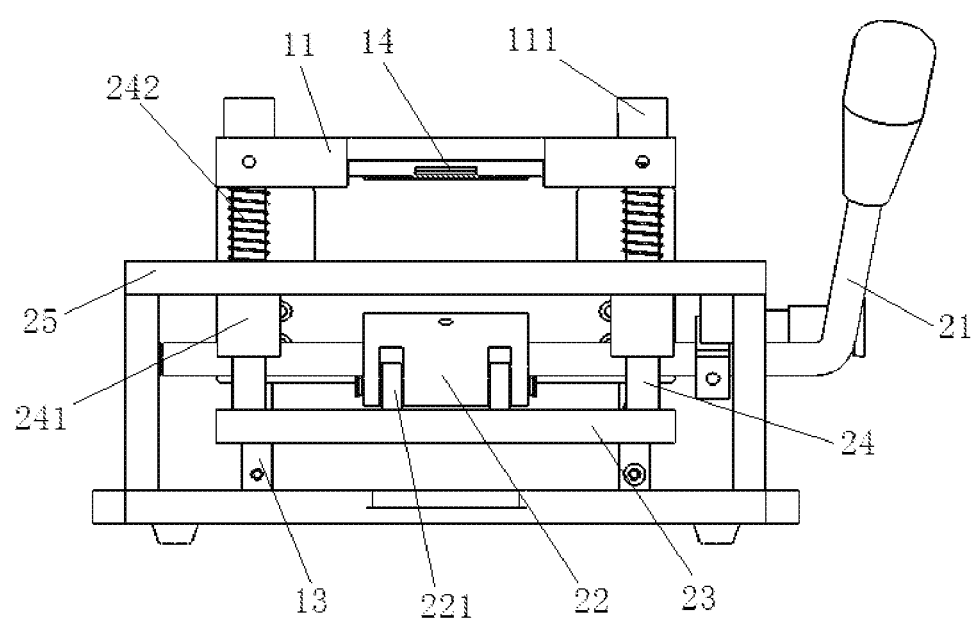
FIG. 2 is a schematic structural view showing an eccentric mechanism according to the embodiment of the present disclosure.
Figure 3:
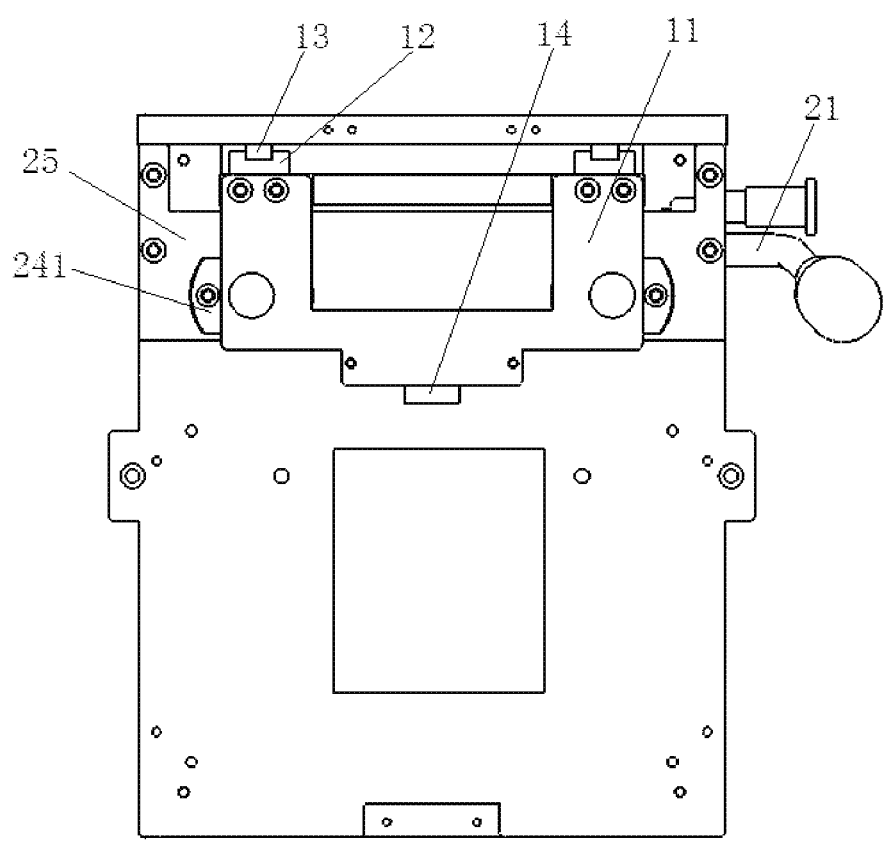
FIG. 3 is a schematic top view showing a pressing connection mechanism according to the embodiment of the present disclosure.
Figure 4:
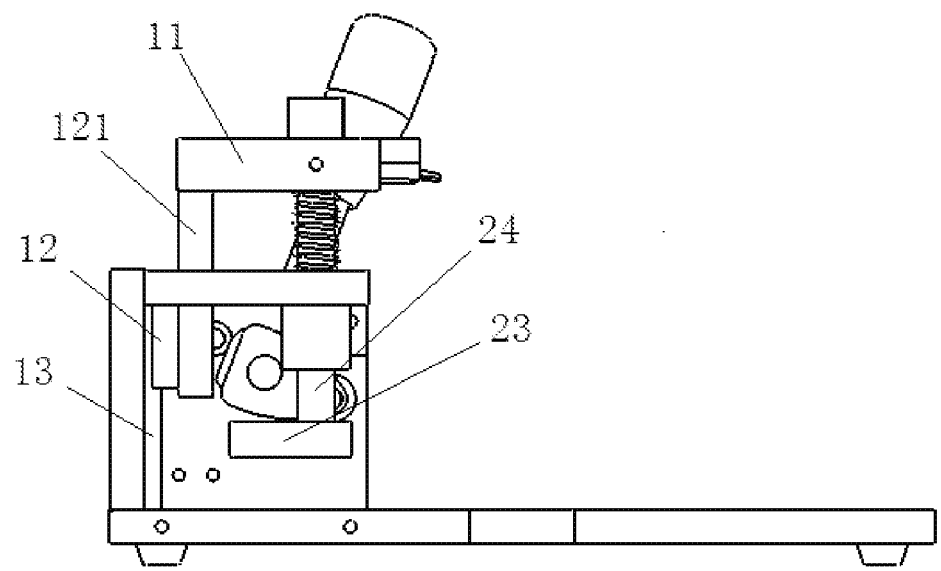
FIG. 4 is a schematic side view showing a pressing connection mechanism according to the embodiment of the present disclosure.

In conjunction with FIGS. 1 and 2, the eccentric mechanism 2 comprises an eccentric handle 21, a main eccentric block 22, a stress-bearing plate 23 and a guide shaft 24, the main eccentric block 22 being mounted to an eccentric handle 21, the stress-bearing plate 23 being positioned below the main eccentric block 22, the stress-bearing plate 23 being mounted with two guide shafts 24, the guide shaft 24 being connected to the pressing connection mechanism 1. Above the main eccentric block 22 is provided with a bearing plate 25. The eccentric handle 21 is configured to drive the main eccentric block 22 to rotate and press downward to the stress-bearing plate 23, and meanwhile the stress-bearing plate 23 moves downwards in the Y direction. The stress-bearing plate 23 drives the pressing connection mechanism 1 via the guide shaft 24 to move downwards in the Y direction, thereby completing a downward pressing connection motion in the Y direction. Each of the guide shafts 24 is sleeved with a restoring spring 242. The restoring spring 242 is positioned between the bearing plate 25 and the pressing connection mechanism 1. When the pressing connection mechanism 1 moves downwards in the Y direction, the spring 242 is compressed. After a test is completed, the restoring spring 242 provides an elastic force for upward restoration movement of the pressing connection mechanism 1.

The bearing plate 25 is fixed with a flange bearing 241, and the guide shaft 24 penetrates through the flange bearing 241 and is connected to the pressing connection mechanism 1. The guidance function of the flange bearing 241 enables the pressing connection mechanism 1 to move up and down steadily and accurately.

The test fixture uses the eccentric mechanism 2 as the mechanical structure of primary motion of the pressing connection mechanism 1 so that the rotational movement of the eccentric handle 21 is converted to vertical movement of the pressing connection mechanism 1 above the bearing plate 25, providing a driving force required for the vertical movement of the pressing connection mechanism 1 during the test and for the vertical movement of the restoration to original state thereof after the test is completed. Simple whole structure, stable properties and fixed vertical position makes the operation easy and maintenance convenient.

Further, in the test fixture, the main eccentric block 22 is mounted in the middle of the eccentric handle 21, resulting in higher eccentric stability. Moreover, the main eccentric block 22 has a width of 50-80 mm, preferably 50 mm, so that the main eccentric block 22 is combined with the eccentric handle 21 more fully.

Moreover, the shape of the main eccentric block 22 can be self-designed according to actual requirements. The main eccentric block 22 may be positioned by positioning stop blocks (not shown in the figures) on both sides thereof so as to provide the positioning of the pressing connection mechanism 1 in the Y direction.

Preferably, between the main eccentric block 22 and the stress-bearing plate 23 is provided with a rolling bearing 221. The main eccentric block 22 comes into contact with the stress-bearing plate 23 via the rolling bearing 221 such that the rolling transmission in the movement reduces friction coefficient and increases the wear resistance of a contact surface and the convenience of operation.

As shown in FIGS. 1-4, the pressing connection mechanism 1 comprises a main pressing head 11, pressing connection sliders 12 and pressing connection guide rails 13, one end of the main pressing head 11 being fixed on the guide shaft 24, and the other end thereof being mounted to the pressing connection guide rails 13 via sliding of the pressing connection sliders 12. A pressing connection shape of the main pressing head 11 is capable of being engaged to a silica gel sheet as pressure buffer, a PCB (Printed Circuit Board) or a FPC (Flexible Printed Circuit) to be tested so that a signal source required for the test is in steady and accurate contact and stable connect with the tested product.

For example, the main pressing head 11 is provided with a vice pressing head 14 for mounting FPC.

One end of the main pressing head 11 is fixed to a top end of the guide shaft 24 via an adjuster 111, and the pressing connection slider 12 is mounted to the other end of the main pressing head 11 via a connecting plate 121. The adjuster 111 is configured to conduct pressure adjustment on the main pressing head 11. The adjuster 111 may use an adjusting screw. The male thread of the adjusting screw and a threaded hole in the guide shaft 24 are arranged correspondingly, and the height difference between the main pressing head 11 and a test product is controlled by hand twisting the adjusting screw so as to adjust the pressing connection pressure value in a pressing connection test.

Such manner for engaging the pressing connection slider 12 to the pressing connection guide rail 13 increases guiding accuracy and ensures the pressing connection precision of the main pressing head 11. In the meanwhile, the main material of the test fixture is bakelite, which prevents the damage of static electricity to electronic products.

In order to reduce daily maintenance difficulties and expenses, the test fixture is used as a sliding table mechanism with standardizing components for daily maintenance and modularizing components to be mounted. Specifically, the first adjustment mechanism 4 and the second adjustment mechanism 5 are arranged separately from the working carrier 3 so that all components have universality, and the addition of aligning adjustment makes daily maintenance more convenient.

Figure 5:
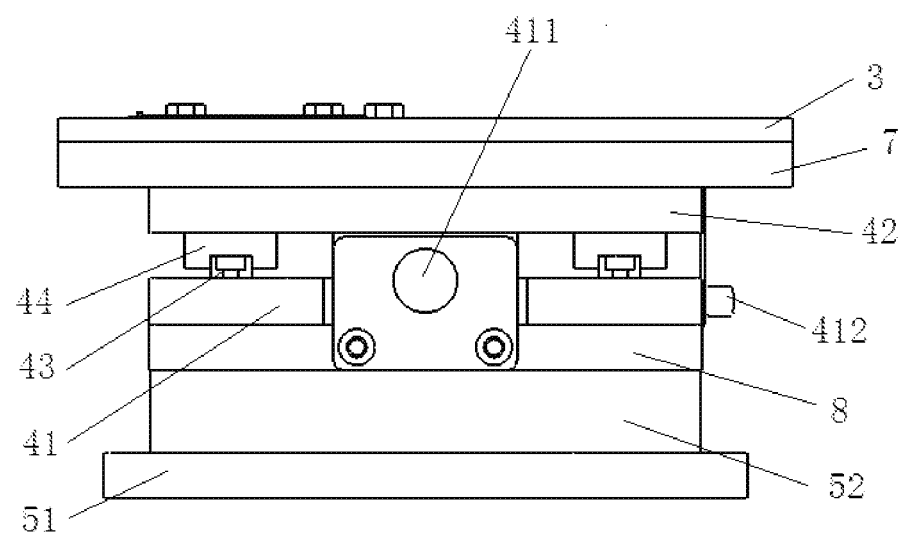
FIG. 5 is a schematic side view showing a working carrier according to the embodiment of the present disclosure.

As shown in FIG. 5, the first adjustment mechanism 4 comprises an X-directional guide rail mounting plate 41, an X-directional slider mounting plate 42, a guiding guide rail 43 and a guiding slider 44. The X-directional guide rail mounting plate 41 is mounted with the guiding guide rail 43 which is arranged in pairs, and the X-directional slider mounting plate 42 is mounted to the guiding guide rail 43 via sliding of the guiding slider 44 for driving the working carrier 3 to move in the X direction. The guiding guide rail 43 and guiding slider 44 are additionally arranged to the first adjustment mechanism 4 such that the working carrier 3 is adjusted more conveniently and has higher stability.

The second adjustment mechanism 5 comprises a Y-directional adjusting carrier 51 and a height adjusting side plate 52. The Y-directional adjusting carrier 51 is mounted with the height adjusting side plate 52, and the height adjusting side plate 52 is positioned under the X-directional guide rail mounting plate 41 for driving the working carrier 3 to move in the Y direction.

Wherein between the height adjusting side plate 52 and the X-directional guide rail mounting plate 41 can be provided with a mounting pad plate 8 for connecting the height adjusting side plate 52 and the X-directional guide rail mounting plate 41.

Figure 6:
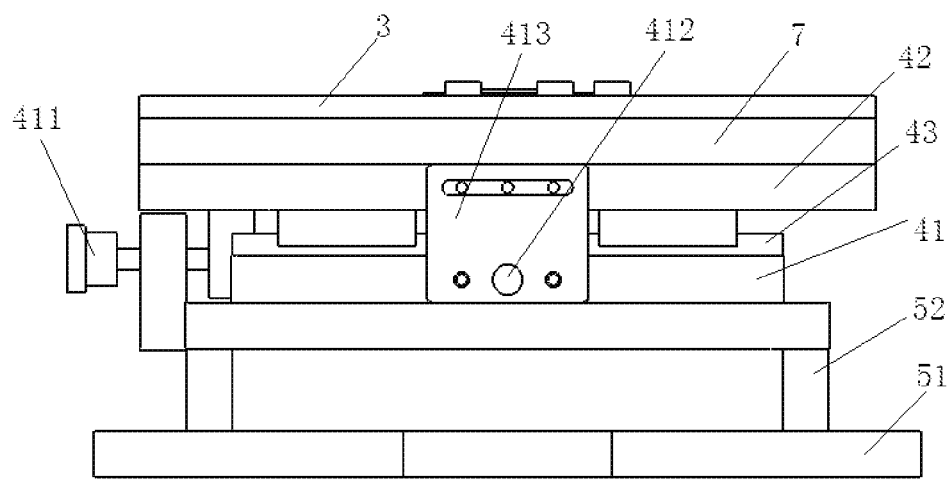
FIG. 6 is a schematic front view showing a working carrier according to the embodiment of the present disclosure.
Figure 7:
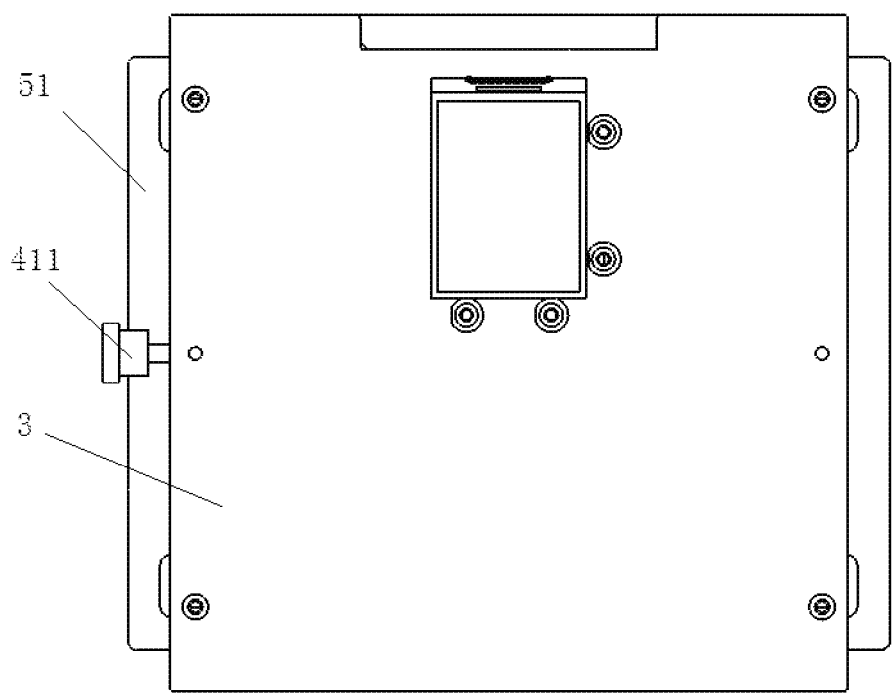
FIG. 7 is a schematic top view showing a working carrier according to the embodiment of the present disclosure.

As shown in FIGS. 6-7, the X-directional guide rail mounting plate 41 is mounted with an adjusting screw 411 and a fastening screw 412. By hand twisting the adjusting screw 411, accurate adjustment of the working carrier 3 in the X direction is provided, and further with the pull-back structure of a tension spring (not shown in the figures), return motion of the working carrier 3 in the X direction is controlled. Moreover, the aligning adjustment of the working carrier 3 in the X direction is achieved by fastening the hand twisted fastening screw 411 to corresponding stainless steel engaged plate 413 to make daily maintenance more convenient.

The Y-directional adjusting carrier 51 may use the fit installation structure including positioning pins, U-shaped slots and fastening screws. The positioning pin and the fastening screw are connected with each other, and the positioning pin can be driven by hand twisting the fastening screw to detach out of a U-shaped slot, thereby it is possible to adjust the carrier 3 in the Y direction. Also, the positioning pin can be driven by fastening the screw to insert into another U-shaped slot, thereby fixing the carrier 3 in the Y direction. The structure enhances operability and guiding stability, and makes it easier to maintain products.

The first adjustment mechanism and the second adjustment mechanism may also adopt a positional adjustment mechanism with other structures.

Figure 8:
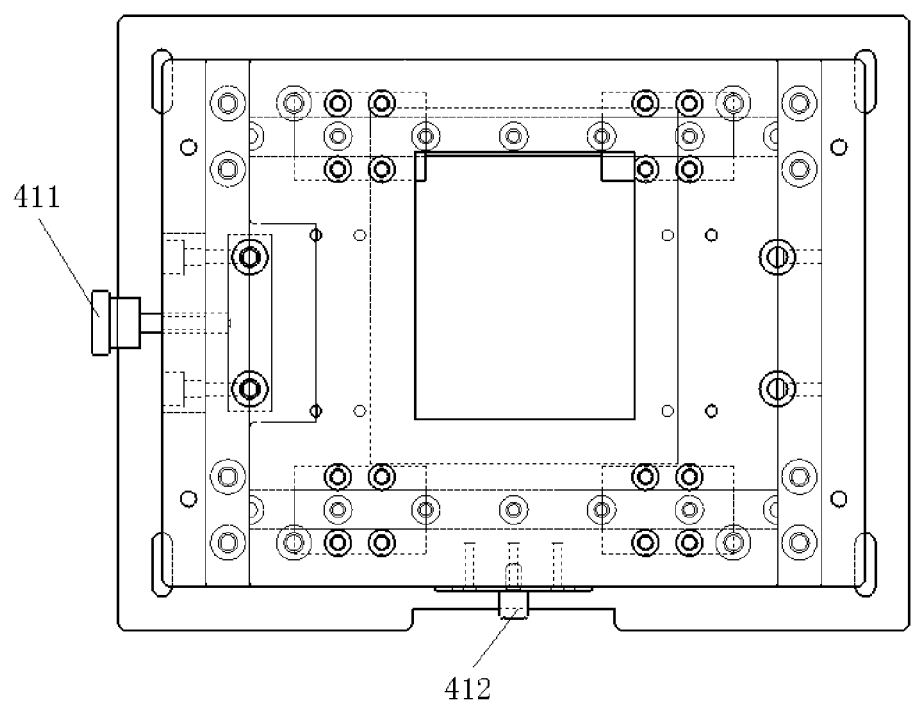
FIG. 8 is a schematic view showing the installation of a working carrier according to the embodiment of the present disclosure.
Figure 9:
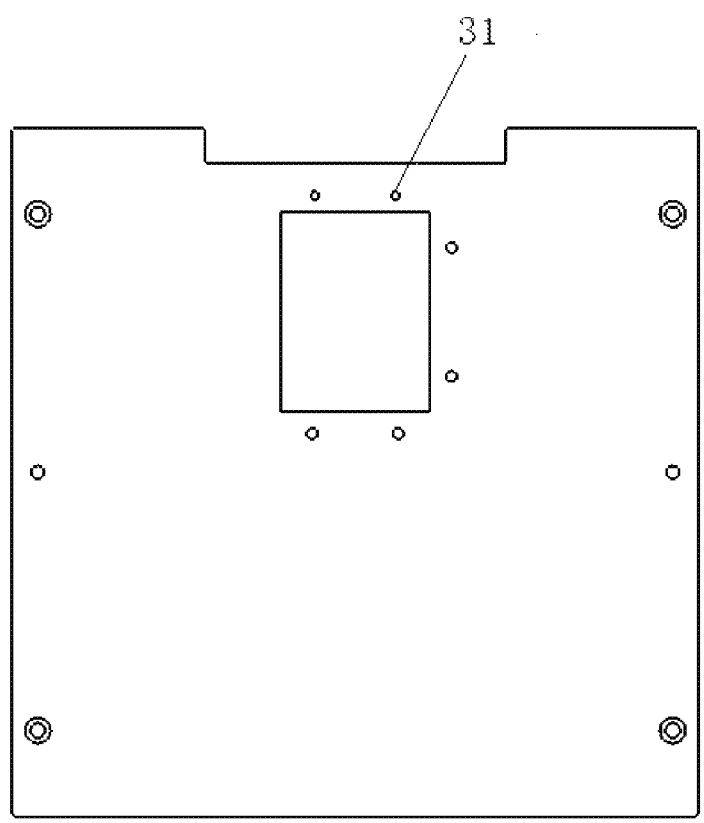
FIG. 9 is a schematic view showing a light hole according to the embodiment of the present disclosure.

As shown in FIGS. 8-9, the X-directional guide rail mounting plate 41 is fixed under the working carrier 3 via a backlight plate 7, the working carrier 3 being provided with light holes 31 for aligning adjustment. The light holes 31 are engaged with the backlight plate 7, facilitating the observation of corresponding terminals and more convenient adjustment. Use of modularization and standardization design improves the stability and operability of the test fixture, and reduces the number of assembling components and simplifies production steps.

In conclusion, the eccentric mechanism of the test fixture in the present disclosure drives the pressing connection mechanism to move in the Y direction, and the pressing connection mechanism and the working carrier are arranged correspondingly for conducting a signal pressing connection test for a tested product on the working carrier. The first adjustment mechanism controls and adjusts the working carrier to move in the X direction, and the second adjustment mechanism controls and adjusts the working carrier to move in the Y direction. The test fixture provides a connecting channel for a product in a COG state after a LCD bonds IC and a test machine, so that test signals of the test machine can be transmitted to corresponding signal port in the tested product. And the test fixture can be used for simulating the state of a finished product of a liquid crystal module in a development phase of the tested product or used in sorting defective products in batch production. The test fixture has a simple structure and steady properties, easy to be operated and maintained conveniently.

The embodiment of the present disclosure further provides a test method using the above test fixture.

The embodiment of the present disclosure is given for illustration and description, rather than complete or limited to the form as disclosed herein. Many modifications and variations are obvious for an ordinary person skilled in the art. The selection and description of embodiment are for better explaining the principle and practical application of the disclosure, and enabling an ordinary person skilled in the art to understand the disclosure so as to design various embodiments with improvements suitable for a particular purpose.

What is claimed is:

1. A test fixture, comprising a pressing connection mechanism, an eccentric mechanism, and a working carrier, the pressing connection mechanism and the working carrier being arranged correspondingly, wherein rotation of the eccentric mechanism driving the pressing connection mechanism to move up and down in a Y direction so as to conduct a signal pressing connection test for a tested product on the working carrier.

2. The test fixture according to claim 1, further comprising:

a first adjustment mechanism for controlling and adjusting the working carrier to move left and right in an X direction, and a second adjustment mechanism for controlling and adjusting the working carrier to move up and down in the Y direction.

3. The test fixture according to claim 1, wherein the eccentric mechanism comprises a main eccentric block, a stress-bearing plate and a guide shaft, the stress-bearing plate being positioned below the main eccentric block, the stress-bearing plate being mounted with the guide shaft, the guide shaft being connected to the pressing connection mechanism above the main eccentric block, the main eccentric block rotating and pressing downward to the stress-bearing plate, the stress-bearing plate driving the pressing connection mechanism via the guide shaft to move up and down in the Y direction.

4. The test fixture according to claim 3, wherein the main eccentric block is mounted with an eccentric handle for driving the rotation of the main eccentric block.

5. The test fixture according to claim 3, wherein a bearing plate is provided between the main eccentric block and the pressing connection mechanism, a flange bearing is fixed on the bearing plate, and the guide shaft penetrates through the flange bearing and is connected to the pressing connection mechanism.

6. The test fixture according to claim 5, wherein, a restoring spring is provided out of the guide shaft, the reset spring is positioned between the bearing plate and the pressing connection mechanism for restoring the pressing connection mechanism upward after a test is completed.

7. The test fixture according to claim 5, wherein a rolling bearing is provided between the main eccentric block and the stress-bearing plate.

8. The test fixture according to claim 5, wherein the pressing connection mechanism comprises a main pressing head, a pressing connection slider and a pressing connection guide rail, one end of the main pressing head being fixed on the guide shaft, and the other end of the main pressing head being slidablely mounted to the pressing connection guide rail via the pressing connection slider in up and down directions.

9. The test fixture according to claim 8, wherein the main pressing head is provided with a vice pressing head for mounting the tested product.

10. The test fixture according to claim 8, wherein one end of the main pressing head is fixed to a top end of the guide shaft via an adjuster, and the pressing connection slider is mounted to the other end of the main pressing head via a connecting plate.

11. The test fixture according to claim 2, wherein the first adjustment mechanism comprises an X-directional guide rail mounting plate, an X-directional slider mounting plate, a guiding guide rail and a guiding slider, the guiding guide rail is mounted on the X-directional guide rail mounting plate, the X-directional slider mounting plate is slidablely mounted to the guiding guide rail via the guiding slider for driving the working carrier to move in the X direction.

12. The test fixture according to claim 11, wherein the X-directional guide rail mounting plate is fixed under the working carrier via a backlight plate, and a light hole is provided on the working carrier for aligning adjustment.

13. The test fixture according to claim 12, wherein an adjusting screw and a fastening screw are mounted on the X-directional guide rail mounting plate.

14. The test fixture according to claim 5, wherein the second adjustment mechanism comprises a Y-directional adjusting carrier and a height adjusting side plate, the height adjusting side plate is provided on the Y-directional adjusting carrier, the height adjusting side plate is provided under the X-directional guide rail mounting plate for driving the working carrier to move in the Y direction.

15. The test fixture according to claim 8, wherein a pressing connection shape of the main pressing head is engaged to a silica gel sheet as a pressure buffer, a PCB or a FPC to be tested so that a signal source required for the test is steadily and accurately contacted with and stably connected with the tested product.

16. A test method using a test fixture, wherein the test fixture comprises a pressing connection mechanism, an eccentric mechanism, and a working carrier, the pressing connection mechanism and the working carrier being arranged correspondingly, wherein rotation of the eccentric mechanism driving the pressing connection mechanism to move up and down in a Y direction so as to conduct a signal pressing connection test for a tested product on the working carrier.

17. The test method according to claim 16, wherein the test fixture further comprises a first adjustment mechanism for controlling and adjusting the working carrier to move left and right in an X direction, and a second adjustment mechanism for controlling and adjusting the working carrier to move up and down in the Y direction.

18. The test method according to claim 16, wherein the eccentric mechanism comprises a main eccentric block, a stress-bearing plate and a guide shaft, the stress-bearing plate being positioned below the main eccentric block, the stress-bearing plate being mounted with the guide shaft, the guide shaft being connected to the pressing connection mechanism above the main eccentric block, the main eccentric block rotating and pressing downward to the stress-bearing plate, the stress-bearing plate driving the pressing connection mechanism via the guide shaft to move up and down in the Y direction.

19. The test method according to claim 18, wherein a bearing plate is provided between the main eccentric block and the pressing connection mechanism, a flange bearing is fixed on the bearing plate, and the guide shaft penetrates through the flange bearing and is connected to the pressing connection mechanism.

20. The test method according to claim 18, wherein a restoring spring is provided out of the guide shaft, the restoring spring is positioned between the bearing plate and the pressing connection mechanism for restoring the pressing connection mechanism upward after a test is completed; and a rolling bearing is provided between the main eccentric block and the stress-bearing plate.

* * * * *